(12) United States Patent
Shen

(10) Patent No.: US 8,242,690 B2
(45) Date of Patent: Aug. 14, 2012

(54) LIGHT-EMITTING DIODE DIE PACKAGES AND ILLUMINATION APPARATUSES USING SAME

(75) Inventor: Yu-Nung Shen, Taipei (TW)

(73) Assignee: Evergrand Holdings Limited, Tortola (VG)

( * ) Notice: Subject to any disclaimer, the term of this patent is extended or adjusted under 35 U.S.C. 154(b) by 208 days.

(21) Appl. No.: 12/703,369

(22) Filed: Feb. 10, 2010

(65) Prior Publication Data

US 2010/0141132 A1    Jun. 10, 2010

(30) Foreign Application Priority Data

Apr. 29, 2005   (TW) ................. 94113941 A
Feb. 11, 2009   (TW) ................. 98104418 A

(51) Int. Cl.
*H01J 1/62* (2006.01)

(52) U.S. Cl. ........................................ 313/506; 313/498

(58) Field of Classification Search .................. 313/498, 313/502, 506, 509, 512
See application file for complete search history.

(56) References Cited

U.S. PATENT DOCUMENTS

2010/0123148 A1*   5/2010   Park ................................ 257/94
* cited by examiner

*Primary Examiner* — Vip Patel
(74) *Attorney, Agent, or Firm* — Jackson IPG PLLC

(57) ABSTRACT

The present invention relates to an LED die package, which has a light-emitting diode die having a sapphire layer, a first doped layer doped with a p- or n-type dopant, and a second doped layer doped with a different dopant from that doped in the first doped layer. A surface of the sapphire layer opposite to the surface on which the first doped layer is disposed is formed with generally inverted-pyramidal-shaped recesses and overlaid with a phosphor powder layer. Each of the first and the second doped layers has an electrode-forming surface formed with an electrode, on which an insulation layer is disposed and formed with exposure holes for exposing the electrodes. The exposure holes are each filled with an electrically conductive linker.

7 Claims, 15 Drawing Sheets

LIGHT-EMITTING DIODE DIE PACKAGES AND ILLUMINATION APPARATUSES USING SAME

BACKGROUND OF THE INVENTION

1. Field of the Invention

The present invention relates to light-emitting diode (LED) die packages and illumination apparatuses using the same, and more particularly, to highly reliable LED die packages and illumination apparatuses using the same.

2. Description of the Prior Art

As the global trend of energy saving continuously progresses, light-emitting diodes play an increasingly important role in this regard, in view of the fact that they have been used more and more in the replacement of traditional light sources. However, the thermal dissipation ability of LEDs should still be improved to realize a more ideal light source.

In view of the above, the inventor has devised LED die packages, as well as illumination apparatuses using the same, to fulfill the need in this respect.

SUMMARY OF THE INVENTION

Accordingly, an object of the invention is to provide an LED die package and an illumination apparatus using the same.

In order to achieve this object, a light-emitting diode die package according to a technical feature of the invention is provided, which comprises a light-emitting diode die having a sapphire layer, a first doped layer disposed on the sapphire layer and doped with a p- or n-type dopant, and a second doped layer disposed on the first doped layer and doped with a different dopant from that doped in the first doped layer, wherein a surface of the sapphire layer opposite to the surface on which the first doped layer is disposed is formed with a plurality of generally inverted-pyramidal-shaped recesses, and wherein each of the first doped layer and the second doped layer has an electrode-forming surface formed with an electrode; a phosphor powder layer disposed on the surface of the sapphire layer formed with the recesses; an insulation layer disposed on the electrode-forming surfaces and formed with a plurality of exposure holes for exposing the electrodes corresponding thereto; and a plurality of electrically conductive linkers, each being formed within one of the exposure holes.

According to another technical feature of the invention, a light-emitting diode die package is provided, which comprises at least two light-emitting diode dies, each having a sapphire layer, a first doped layer disposed on the sapphire layer and doped with a p- or n-type dopant, and a second doped layer disposed on the first doped layer and doped with a different dopant from that doped in the first doped layer, wherein each of the first doped layers and the second doped layers has an electrode-forming surface formed with an electrode, and wherein a gap is provided between the first doped layers of two light-emitting diode dies, so that a continuous metal layer present between the first doped layers of neighboring LED dies is divided; a first insulation layer disposed on the electrode-forming surfaces of the first doped layers and the second doped layers, the first insulation layer being formed with a plurality of exposure holes for exposing the corresponding electrodes of the first doped layers and the second doped layers; a second insulation layer disposed on the first insulation layer, the second insulation layer being formed with a plurality of communication holes and a plurality of through holes, wherein each of the communication holes is adapted for communicating two exposure holes with each other, with the two exposure holes exposing two electrodes that have opposite polarity and reside in neighboring light-emitting diode dies, and wherein each of the through holes is registered with an exposure hole for exposing an electrode that need not be electrically connected to any electrode located in neighboring light-emitting diode dies; conductors formed within the exposure holes, the communication holes and the through holes, so that the light-emitting diode dies are electrically connected in series; a cover layer disposed on the second insulation layer and formed with a plurality of open holes, each being registered with a through hole; and a plurality of electrically conductive linkers formed within the open holes and adapted for electrically connecting the conductors located within the through holes to an external circuit.

According to still another technical feature of the invention, a light-emitting diode die package is provided, which comprises a light-emitting diode die having a sapphire layer, a first doped layer disposed on the sapphire layer and doped with a p- or n-type dopant, and a second doped layer disposed on the first doped layer and doped with a different dopant from that doped in the first doped layer, wherein a surface of the sapphire layer opposite to the surface on which the first doped layer is disposed is formed with a plurality of generally inverted-pyramidal-shaped recesses, and wherein each of the first doped layer and the second doped layer has an electrode-forming surface formed with an electrode, and wherein the recesses comprise inclined walls coated with metal layers; a support plate having a supporting surface, on which conductive contacts are disposed; a heat-dissipating film layer overlaid on the supporting surface of the supporting layer; a thermal conductive film layer overlaid on the heat-dissipating film layer; and a circular seat disposed on the thermal conductive film layer and having an upper edge, the upper edge of the circular seat being provided with conductive contacts, wherein the light-emitting diode die is positioned at a central portion of the circular seat by being secured to the thermal conductive film layer with a metal connecting layer, and wherein the electrodes provided on the first doped layer and the second doped layer are electrically connected to the conductive contacts provided on the circular seat via wires and the conductive contacts provided on the circular seat are electrically connected to the corresponding conductive contacts provided on the support plate via wires.

According to still another technical feature of the invention, a light-emitting diode die package is provided, which comprises a light-emitting diode die having a sapphire layer, a first doped layer disposed on the sapphire layer and doped with a p- or n-type dopant, and a second doped layer disposed on the first doped layer and doped with a different dopant from that doped in the first doped layer, wherein a surface of the sapphire layer opposite to the surface on which the first doped layer is disposed is formed with a plurality of generally inverted-pyramidal-shaped recesses, and wherein each of the first doped layer and the second doped layer has an electrode-forming surface formed with an electrode; a phosphor powder layer disposed on the surface of the sapphire layer formed with the recesses; an insulation layer disposed on the electrode-forming surfaces and formed with a plurality of exposure holes for exposing the electrodes corresponding thereto; a plurality of electrically conductive linkers, each being formed within one of the exposure holes; a support plate having a supporting surface, on which conductive contacts are disposed; a heat-dissipating film layer overlaid on the supporting surface of the support plate and formed with at least two through holes that communicate between an upper surface and a lower surface thereof, wherein the light-emitting diode die is secured to the heat-dissipating film layer, so that the electrically conductive linkers are electrically connected to the conductive contacts of the support plate via the corresponding through holes provided in the heat-dissipating film layer; and a circular seat, placed on the heat-dissipating film layer, so that the light-emitting diode die is located at a central portion of the circular seat.

According to still another technical feature of the invention, an illumination apparatus is provided, which comprises an elongated housing provided at both ends with an electrode adapted for being connected to an external socket, the housing having a base part and a transparent part, wherein the base part has a chamber and a mounting surface; a power supplying circuit unit disposed within the chamber of the base part and provided with an input terminal and an output terminal which are electrically connected to the electrodes located at both ends of the housing; and a light-emitting unit including a mounting substrate disposed on the mounting surface of the base part and a plurality of light-emitting diode die packages according to the invention placed on a mounting surface of the mounting substrate, wherein the mounting surface of the mounting substrate is overlaid with predetermined circuit traces electrically connected to the output terminal of the power supplying circuit unit, and wherein the electrically conductive linkers of the light-emitting diode die packages are electrically connected to the corresponding circuit traces overlaid on the mounting substrate.

According to still another technical feature of the invention, an illumination apparatus is provided, which comprises an elongated housing provided at both ends with an electrode adapted for being connected to an external socket, the housing having a base part and a transparent part, wherein the base part has a chamber and a mounting surface mounted with predetermined circuit traces; a power supplying circuit unit disposed within the chamber of the base part and provided with an input terminal and an output terminal which are electrically connected to the electrodes located at both ends of the housing; and a light-emitting unit including a plurality of light-emitting diode die packages according to the invention placed on the mounting surface of the base part, wherein the electrodes of the light-emitting diode die packages are electrically connected to the corresponding circuit traces overlaid on the mounting surface of the base part.

According to yet still another technical feature of the invention, an illumination apparatus is provided, which comprises a housing including a body, a transparent cap and an adapter, wherein the body has an upper surface and an accommodating chamber accessible through a lower open end of the body, and wherein the transparent cap is fixed to an upper end of the body, and wherein the adapter is mounted at the lower open end of the body; a power supplying circuit unit having a power supplying module which is placed into the accommodating chamber through the lower open end of the body, wherein the power supplying module includes input terminals electrically connected to a positive-voltage electrode and a negative-voltage electrode of the adapter; and a light-emitting unit including a substrate mounted on the upper surface of the body and a plurality of light-emitting diode die packages according to the invention operatively mounted on the substrate, wherein a surface of the substrate on which the light-emitting diode die packages are mounted is overlaid with predetermined circuit traces electrically connected to the electrodes of the light-emitting diode die packages, and wherein the power supplying module has an output terminal which is electrically connected to the corresponding circuit traces overlaid on the substrate via a wire, so that the light-emitting diode die packages can receive electric power from the power supplying module.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
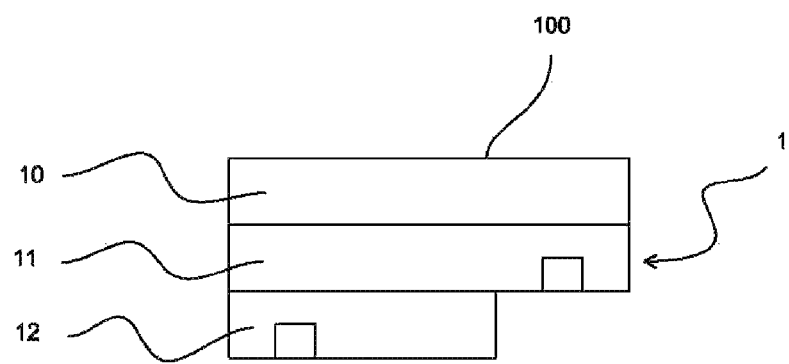
FIGS. 1 to 4 are schematic, cross-sectional flowcharts of a method for packaging an LED die package according to the first preferred embodiment of the invention.

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

FIGS. 1 to 4 are schematic, cross-sectional flowcharts of a method for packaging an LED die package according to the first preferred embodiment of the invention.

Referring to FIGS. 1-4, a light-emitting diode (LED) die 1 is provided. It should be noted that the packaging method according to the invention is carried out on an intact wafer and the LED die 1 remains undiced from the wafer. For clarity, FIGS. 1-3 omit the LED dies neighboring to the LED die 1.

The LED die 1 has a sapphire layer 10, a first doped layer 11 disposed on the sapphire layer 10 and doped with a p- or n-type dopant, and a second doped layer 12 disposed on the first doped layer 11 and doped with a different dopant from that doped in the first doped layer 11.

Figure 2:
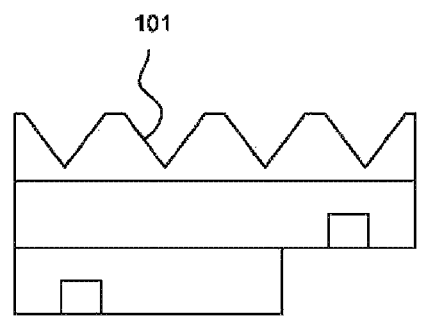

Next, as shown in FIGS. 1 and 2, a surface 100 of the sapphire layer 10 opposite to the surface on which the first doped layer 11 is disposed is subjected to an etching process, so that the surface 100 is formed with a plurality of generally inverted-pyramidal-shaped recesses 101 and turned into a roughened surface 100.

It should be noted that the formation of the recesses 101 is not limited to by performing an etching process. Any process adapted for roughening the surface 100 of the sapphire layer 10 can be used in the invention.

Figure 3:
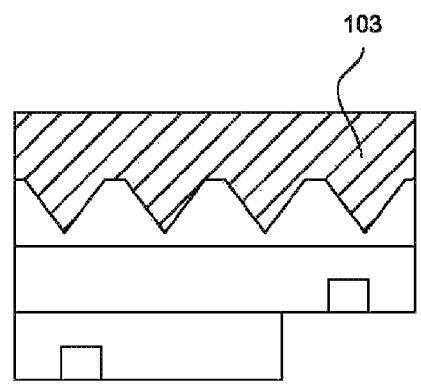

As shown in FIG. 3, a phosphor powder layer 103 is formed on the surface 100 of the sapphire layer 10 in such a manner that the phosphor powder layer 103 extends into the recesses 101.

Since the first and second doped layers 11 and 12 have a refractive index of 2.4, the sapphire layer 10 has a refractive index of 1.7 and the phosphor layer 103 has a refractive index of 1.4, the structure described above achieves a multiple refraction effect and increases the light extraction efficiency by a factor of 24-50%.

Figure 4:
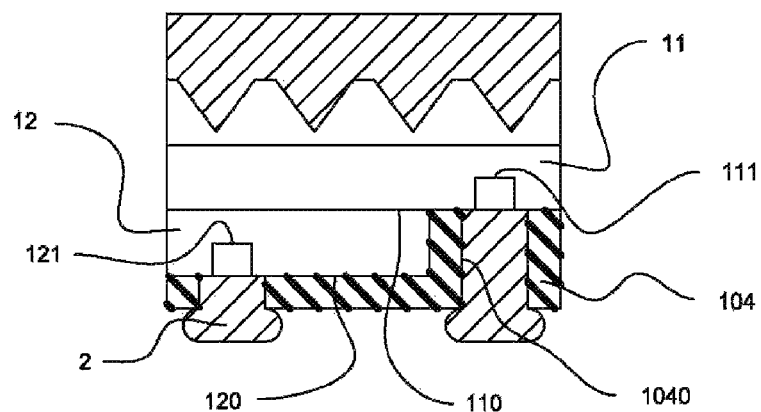
Figure 5:
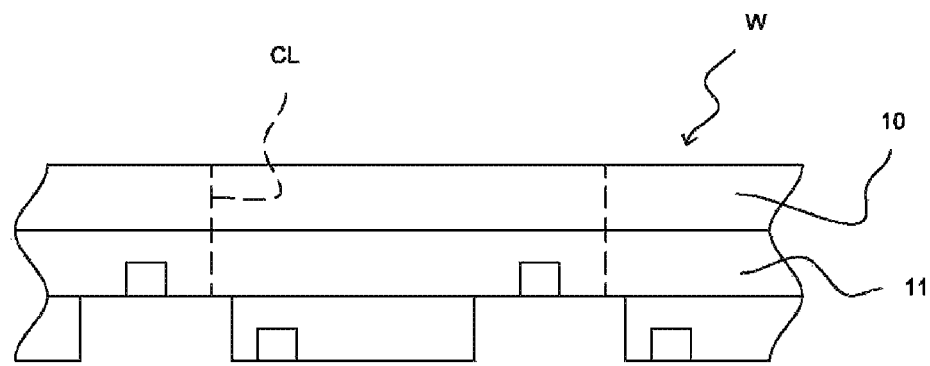
FIGS. 5 to 8 are schematic, cross-sectional flowcharts of a method for packaging an LED die package which includes two or more LED dies electrically connected in series.

As shown in FIG. 4, the first doped layer 11 and the second doped layer 12 have electrode-forming surfaces 110,120 formed with electrodes 111,121, on which an insulation layer 104 is disposed after formation of the phosphor layer 103. The insulation layer 104 is subjected to exposure and development processes to be formed with several exposure holes 1040 for exposing corresponding electrodes 111,121. Each of the exposure holes 1040 is then formed inside with an electrically conductive linker 2 for electrically connecting the electrodes 111,121 to external circuit components (not shown). Finally, the resultant structure is subjected to a dicing process to give an LED die package according to the first preferred embodiment of the invention as shown in FIG. 4.

It should be noted that the insulation layer 104 can be made of a transparent material doped with phosphor powder. In addition, the electrically conductive linker 2 is preferably fabricated by laminating 1 to 6 metal layers together using a vapor depositing process and/or an electro-plating process. For example, the electrically conductive linker 2 is preferably made of a combination of a silver layer, a diamond film layer, a copper layer, a nickel layer and a gold layer, a combination of a silver layer, a copper layer, a nickel layer and a gold layer, or a combination of a chromium layer, a diamond film layer, a silver layer, a copper layer, a nickel layer and a gold layer.

Now referring to FIGS. 5-8, in the case where the LED die package according to the invention includes two or more LED dies electrically connected in series, an LED wafer W, prior to being processed as shown in FIG. 2 or subsequent to being processed as shown in FIG. 3, is subjected to a dicing process along a dicing line CL, so as to generate a gap S between the first doped layers 11 of two neighboring LED dies 1, thereby dividing a continuous metal layer (not shown) present between the first doped layers 11 of neighboring LED dies 1.

Figure 6:
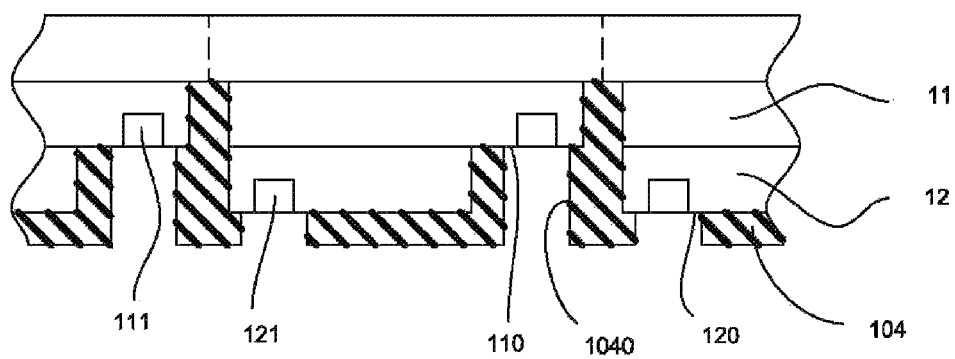

While FIG. 6 demonstrates that the dicing process is carried out to a depth that reaches the sapphire layer 10, it should be noted that the dicing process may be performed to a less extent, so long as the continuous metal layer present between the first doped layers 11 of neighboring LED dies 1 is divided.

Figure 8:
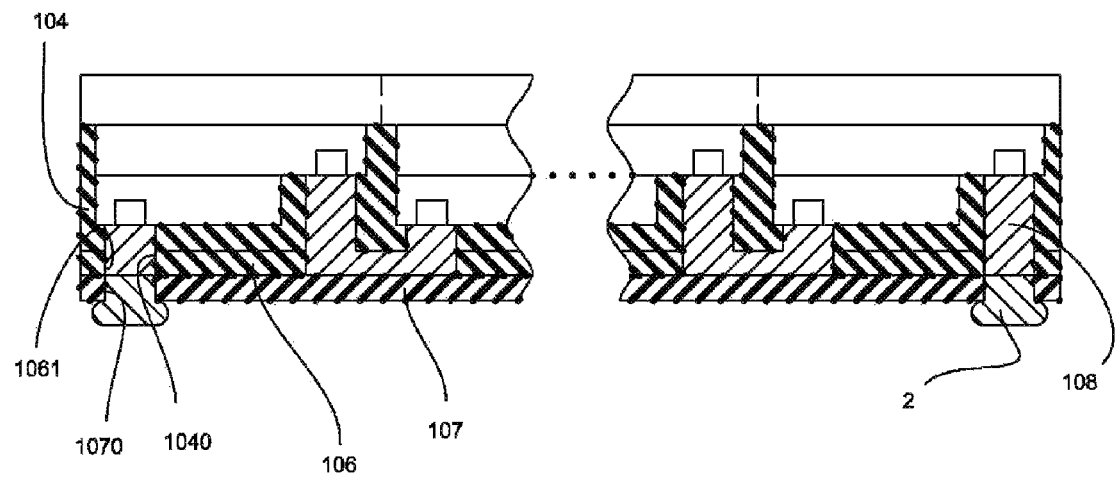

Next, a first insulation layer 104 is formed on the surfaces 110,120 of the first doped layers 11 and the second doped layers 12, with the insulative material being filled into the gaps S. The first insulation layer 104 is subjected to exposure and development processes to be formed with a plurality of exposure holes 1040 for exposing corresponding electrodes 111,121 on the first doped layers 11 and the second doped layers 12. A second insulation layer 106 is then formed on the first insulation layer 104. The second insulation layer 106 is subjected to exposure and development processes to be formed with a plurality of communication holes 1060 and a plurality of through holes 1061. Each of the communication holes 1060 is adapted for communicating two exposure holes 1040 with each other, with the two exposure holes 1040 exposing two electrodes 111,121 that have opposite polarity and reside in neighboring LED dies 1. The through hole 1061 are adapted for exposing the electrodes 111, 121 that need not be electrically connected to any electrodes 111, 121 located in the neighboring LED dies 1. For example, in the case where the LED die package includes ten LED dies electrically connected in series, an electrode 121 located in the first LED die 1 and an electrode 111 located in the tenth LED die 1 are exposed through the exposure holes 1040 and the through holes 1061 registered therewith, as shown in FIG. 8.

Then, conductors 108 are formed within the exposure holes 1040, the communication holes 1060 and the through holes 1061, so that the LED dies 1 are electrically connected in series. A cover layer 107 is then disposed on the second insulation layer 106 and is subjected to exposure and development processes to be formed with a plurality of open holes 1070, each being registered with a through hole 1061. Electrically conductive linkers 2 are then formed within the open holes 1070 and used for electrically connecting to external circuit components. Finally, the resultant structure is subjected to a dicing process to give individual LED die packages having predetermined amounts of LED dies connected in series or in parallel.

Similar to those described in the embodiments above, the insulation layers 104,106,107 are preferably made of transparent material doped with phosphor powder, and the conductors 108 and the electrically conductive linkers 2 are preferably formed by laminating 1 to 6 metal layers together using a vapor depositing process and/or an electro-plating process.

Figure 9:
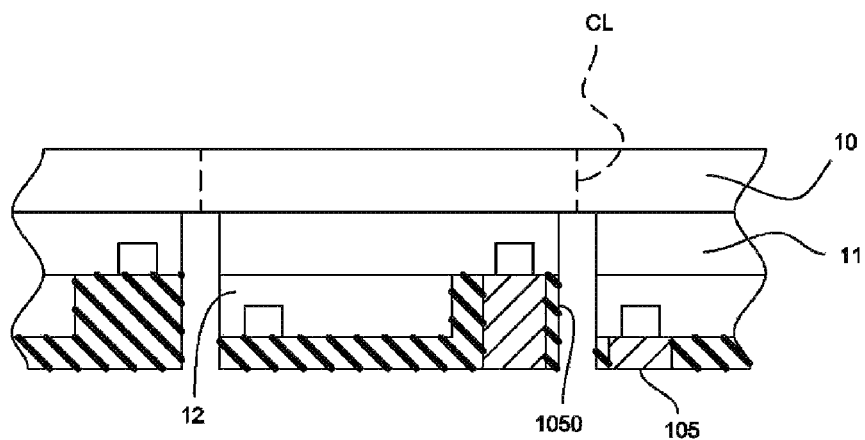
FIGS. 9 to 10 are schematic, cross-sectional flowcharts of an alternative method to that shown in FIGS. 5-8 for packaging an LED die package which includes two or more LED dies electrically connected in series.
Figure 10:
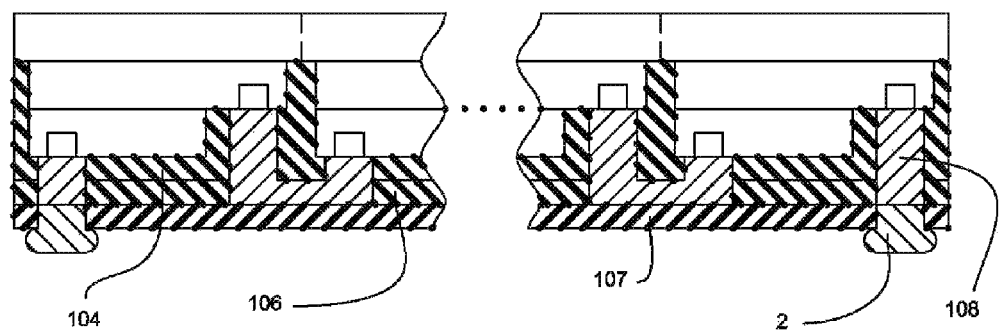

FIGS. 9 and 10 are schematic, cross-sectional flowcharts of an alternative method to that shown in FIGS. 5-8 for packaging an LED die package which includes two or more LED dies electrically connected in series.

As shown in FIG. 9, an LED wafer W, prior to being processed as shown in FIG. 2 or subsequent to being processed as shown in FIG. 3, is formed with a cover layer 105 on the electrode-mounting surfaces 110, 120 of the first doped layers 11 and the second doped layers 12. The cover layer 105 is subjected to exposure and development processes to be formed with a plurality of via holes 1050 for exposing portions of the surfaces 110 of the first doped layers 11 that are proximal to the dicing lines CL. The portions of the first doped layers 11 which are exposed by the via holes 1050 are then removed by chemical etching, so as to divide a continuous metal layer (not shown) present between the first doped layers 11 of neighboring LED dies 1. Similarly, while FIG. 9 demonstrates that the dicing process is carried out to a depth that reaches the sapphire layer 10, the dicing process may be performed to a less extent, so long as the continuous metal layer present between the first doped layers 11 of neighboring LED dies 1 is divided.

Figure 7:
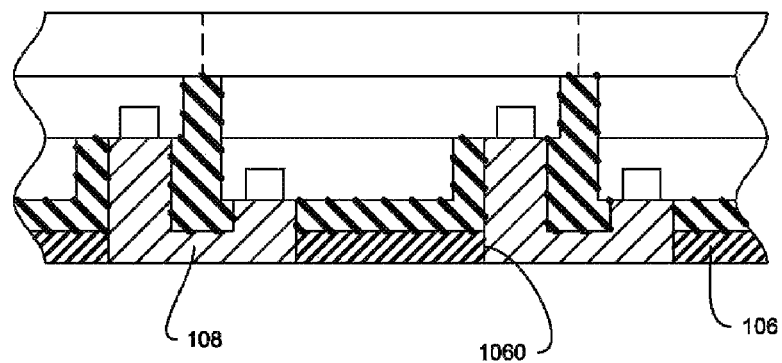

Next, the cover layer 105 is removed and the processes shown in FIGS. 6 to 8 are performed afterwards to result in a structure shown in FIG. 10. Finally, the resultant structure is subjected to a dicing process to give individual LED die packages having predetermined amounts of LED dies electrically connected in series or in parallel.

Similar to those described in the embodiments above, the insulation layers 104,106,107 are preferably made of transparent material doped with phosphor powder, and the conductors 108 and the electrically conductive linkers 2 are preferably formed by laminating 1 to 6 metal layers together using a vapor depositing process and/or an electro-plating process.

Figure 11:
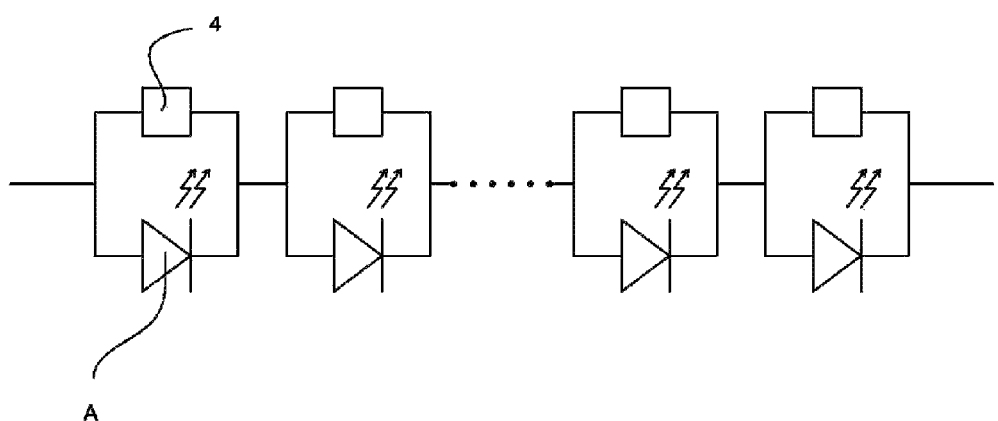
FIG. 11 is an equivalent circuit diagram for an LED die package which includes two or more LED dies electrically connected in series.

FIG. 11 is an equivalent circuit diagram for the LED dies connected in series shown in FIGS. 8 and 10.

As shown in FIG. 11, each of the LED dies 1 may be electrically connected in parallel to a fuse unit 6 made of $SiOH_4$. When an LED die 1 fails to work and causes an open circuit, the fuse unit 6 corresponding thereto melts down due to overvoltage and is therefore short-circuited to turn into an electrically connected state. Hence, even if one of the LED dies 1 connected in series fails to function normally, the rest of them would remain operating. The conventional problem in this respect is overcome accordingly.

Figure 12:
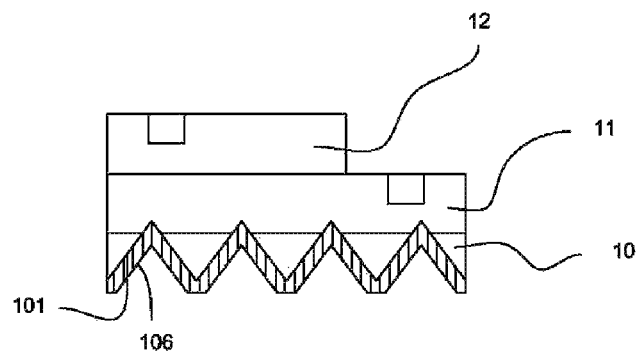
FIGS. 12 to 13 are schematic, cross-sectional flowcharts of a method for packaging an LED die package according to the second preferred embodiment of the invention.
Figure 13:
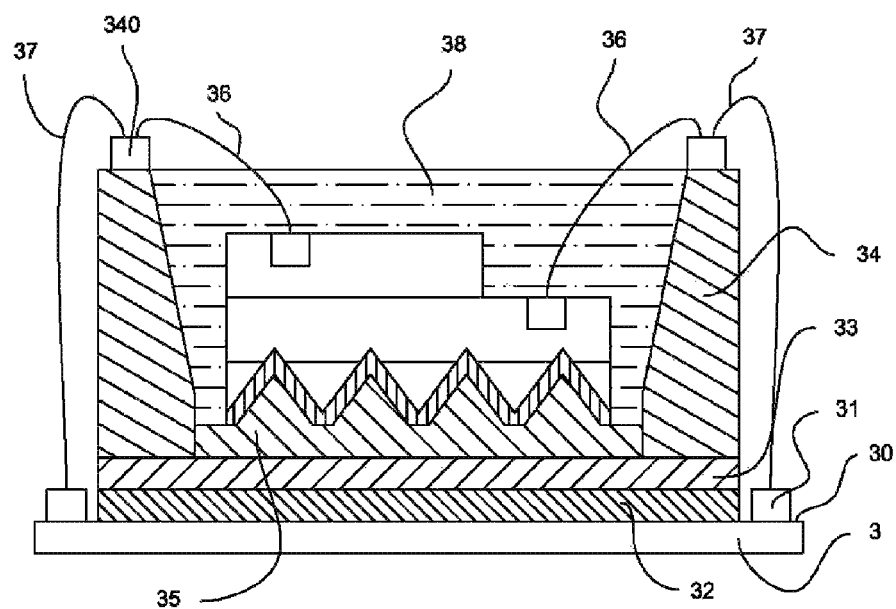

FIGS. 12 to 13 are schematic, cross-sectional flowcharts of a method for packaging an LED die package according to the second preferred embodiment of the invention;

Contrary to the first preferred embodiment, this embodiment as shown in FIG. 12 is featured by, after formation of recesses 101 on a sapphire layer 10, coating a metal layer 102 on inclined walls of the recesses 101. The LED wafer is then subjected to a dicing process to obtain a plurality of LED dies shown in FIG. 12.

Next, a support plate 3 is prepared as shown in FIG. 13. The support plate 3 has a supporting surface 30, on which a plurality of conductive contacts 31 and predetermined circuit traces (not shown) for being electrically connected to the conductive contacts 31 are disposed. The supporting surface 30 of the support plate 3 is overlaid with a heat-dissipating film layer 32 made by a material having a thermal conductivity between 900 W/(m·K) to 1200 W/(m·K), such as a diamond material. The heat-dissipating film layer 32 is overlaid with a thermal conductive film layer 33 made by a material having a thermal conductivity between 400 W/(m·K) to 700 W/(m·K), such as pyrolytic graphite.

A circular seat 34 made of silicon is then placed on the thermal conductive film layer 33. An upper edge of the circular seat 34 is provided with conductive contacts 340. The LED die shown in FIG. 13 is then positioned at a central portion of the circular seat 34 by being secured to the thermal conductive film layer 33 with a metal connecting layer 35. The electrodes 111,121 provided on the first doped layer 11 and the second doped layer 12 are electrically connected to the conductive contacts 340 provided on the circular seat 34 via wires 36, whereas the conductive contacts 340 provided on the circular seat 34 are electrically connected to the corresponding conductive contacts 31 provided on the support plate 3 via wires 37.

Finally, a phosphor layer 38 is formed at the central portion of the circular seat 34 in a manner covering the LED die.

Figure 14:
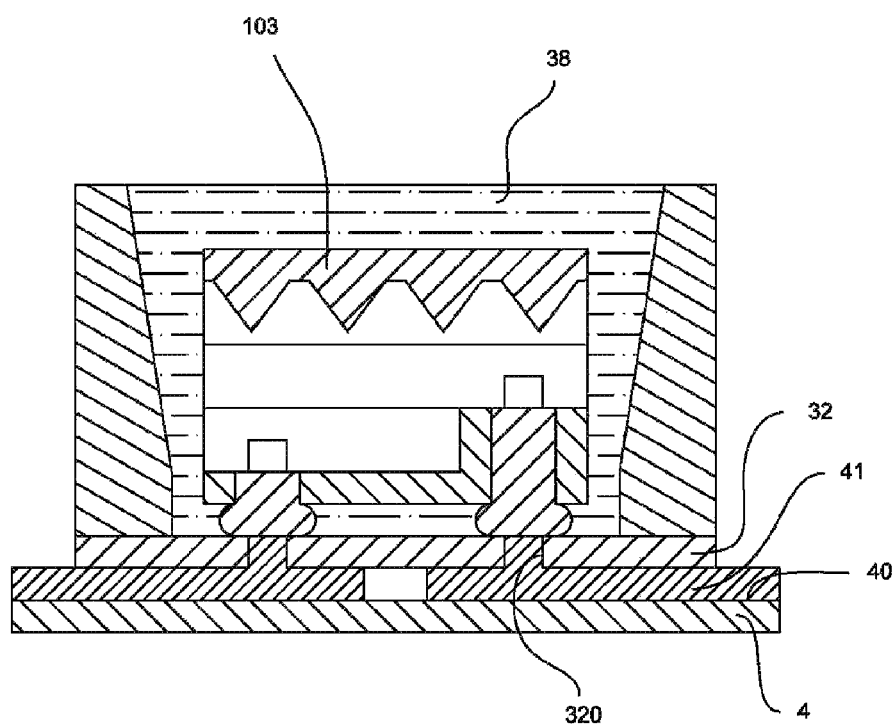
FIG. 14 is a schematic cross-sectional view of an LED die package according to the third preferred embodiment of the invention.

FIG. 14 is a schematic cross-sectional view of an LED die package according to the third preferred embodiment of the invention. An LED die shown in FIG. 4 and a support plate 4 are first provided. The support plate 4 has a supporting surface 40, on which a plurality of conductive contacts 41 and predetermined circuit traces (not shown) are disposed. The supporting surface 40 of the support plate 4 is overlaid with a heat-dissipating film layer 32 described in the second preferred embodiment. Contrary to the second preferred embodiment, the heat-dissipating film layer 32 used herein is formed with at least two through holes 320 that communicate between the upper and lower surfaces of the layer 32.

The LED die shown in FIG. 4 is secured to the heat-dissipating film layer 32 by a suitable process, such as reflow soldering, so that the electrically conductive linkers 2 are electrically connected to the conductive contacts 41 of the support plate 4 via the corresponding through holes 320 in the heat-dissipating film layer 32. A circular seat 34 described in the second preferred embodiment is then placed on the heat-dissipating film layer 32, so that the LED die is located at a central portion of the circular seat 34.

Finally, a phosphor layer 38 is formed at the central portion of the circular seat 34 in a manner covering the LED die. It should be noted, however, that a phosphor layer 103 is optional in this embodiment and can be omitted due to the provision of the phosphor layer 38.

Figure 15:
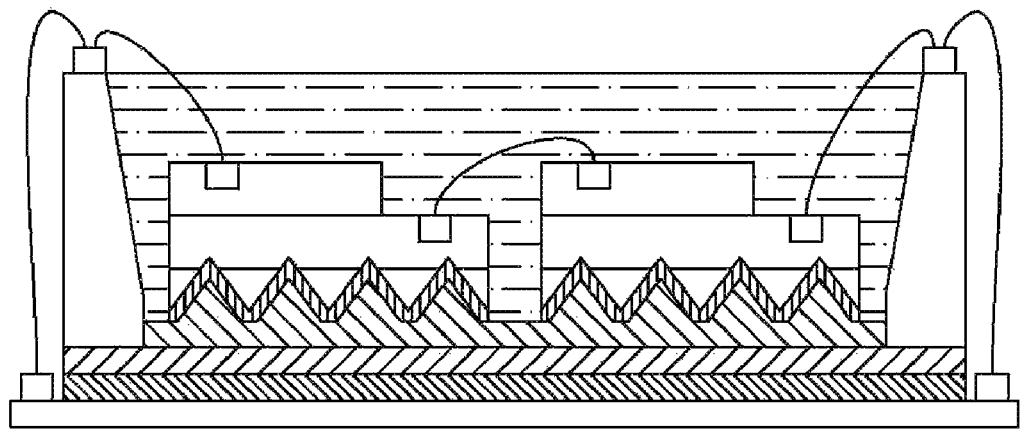
FIG. 15 is a schematic cross-sectional view of an LED die package according to the four preferred embodiment of the invention.

FIG. 15 is a schematic cross-sectional view of an LED die package according to the fourth preferred embodiment of the invention. Contrary to the second preferred embodiment, this embodiment includes two or more LED dies electrically connected in series or in parallel. It should be noted that the LED dies according to this embodiment may be electrically connected in series, in parallel, or partly in series and partly in parallel. Since this embodiment merely differs from the second preferred embodiment in the amount of LED dies mounted in an LED die package, the details thereof are omitted for brevity.

Figure 16:
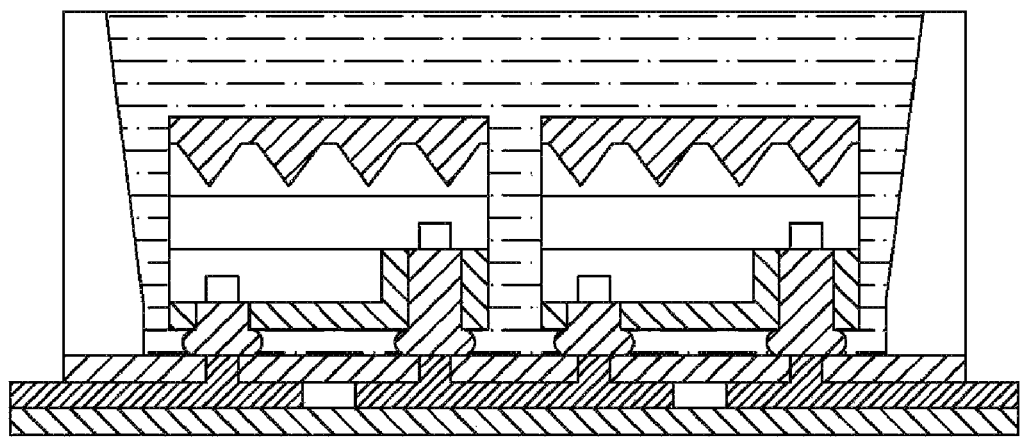
FIG. 16 is a schematic cross-sectional view of an LED die package according to the fifth preferred embodiment of the invention.

FIG. 16 is a schematic cross-sectional view of an LED die package according to the fifth preferred embodiment of the invention. Contrary to the third preferred embodiment, this embodiment includes two or more LED dies electrically connected in series or in parallel. It should be noted that the LED dies according to this embodiment may be electrically connected in series, in parallel, or partly in series and partly in parallel. Since this embodiment merely differs from the third preferred embodiment in the amount of LED dies mounted in an LED die package, the details thereof are omitted for brevity.

Figure 17:
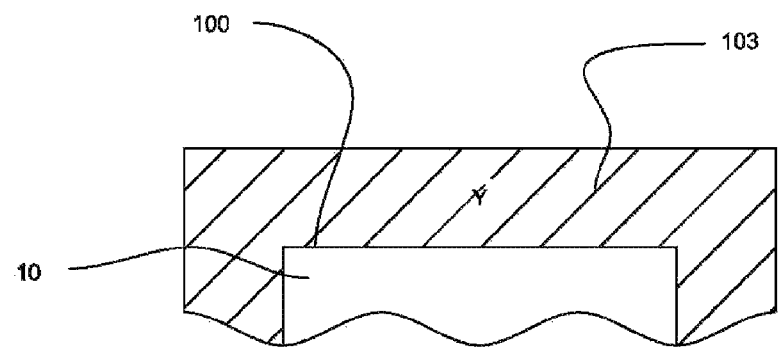
FIGS. 17 to 19 are schematic cross-sectional views of alternative examples of the phosphor layer 103 in the first preferred embodiment.
Figure 18:
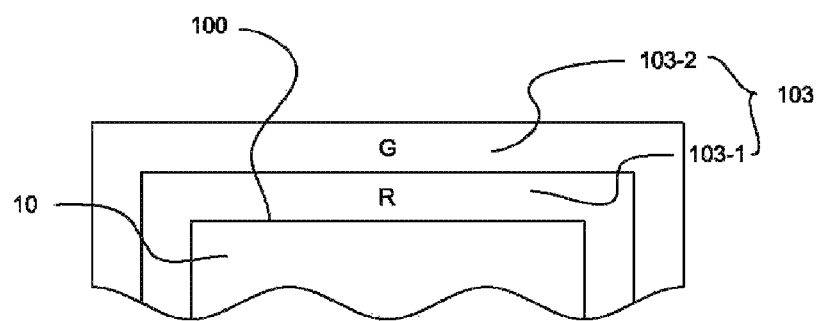
Figure 19:
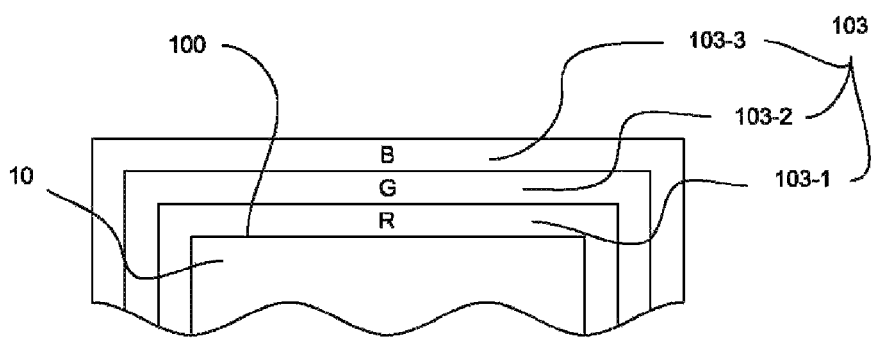

FIGS. 17 to 19 are schematic cross-sectional views of alternative examples of the phosphor layer 103 in the first preferred embodiment.

As shown in FIG. 17, the phosphor layer 103 disposed on the surface 100 of the sapphire layer 10 is a yellow phosphor layer. It should be noted that the phosphor layer 103 is provided to extensively cover side surfaces of the sapphire layer 10.

As shown in FIG. 18, the phosphor layer 103 disposed on the surface 100 of the sapphire layer 10 is composed of a red phosphor layer 103-1 and a green phosphor layer 103-2. It should be noted that the phosphor layer 103 is provided to extensively cover side surfaces of the sapphire layer 10.

As shown in FIG. 19, the phosphor layer 103 disposed on the surface 100 of the sapphire layer 10 is composed of a red phosphor layer 103-1, a green phosphor layer 103-2 and a blue phosphor layer 103-3. It should be noted that the phosphor layer 103 is provided to extensively cover side surfaces of the sapphire layer 10.

Figure 20:
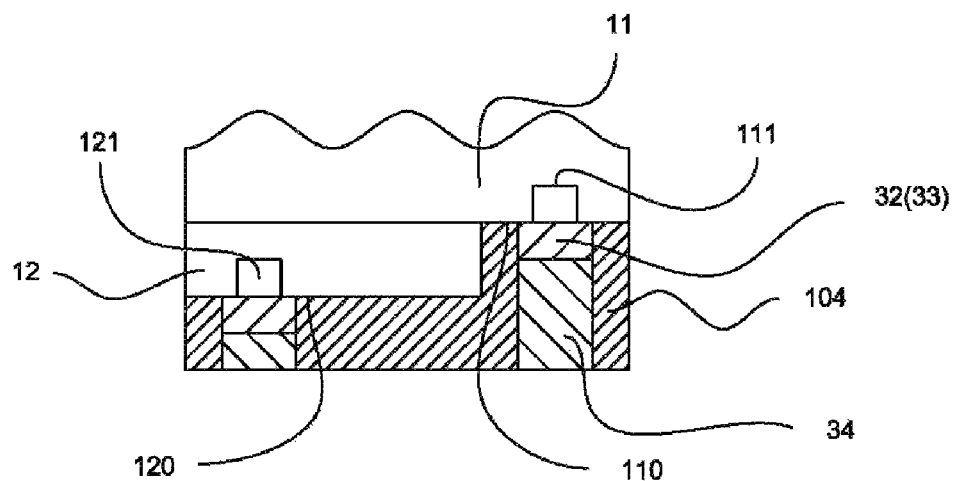
FIGS. 20 and 21 are schematic, cross-sectional flowcharts of an alternative method for packaging an LED die package according to the first preferred embodiment of the invention.
Figure 21:
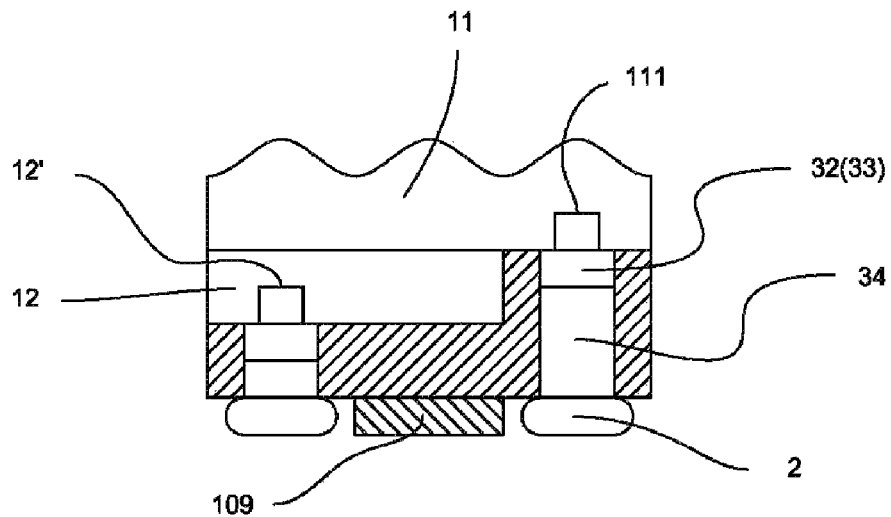

FIGS. 20 and 21 are schematic, cross-sectional flowcharts of an alternative method for packaging an LED die package according to the first preferred embodiment of the invention.

As shown in FIG. 20, contrary to the first preferred embodiment, a heat-dissipating film layer 32 or a thermal conductive film layer 33 described in the second preferred embodiment is disposed on portions of the electrode-mounting surfaces 110, 120 that are exposed by the exposure holes 1040, after the formation of the exposure holes 1040 in the insulation layer 104. The heat-dissipating film layer 32 or the thermal conductive film layer 33 is then overlaid with a high thermal conductive metal layer 34 composed of a nickel layer combined with a gold layer, or an aluminum layer combined with a copper layer. It should be noted, however, that the metal layer 34 may be a copper layer. Alternatively, the metal layer 34 may be made of any suitable metal or alloy, such as Al, $AlN_3$, Cu, $BN_3$ and the like.

A protective layer 109 is then formed on the insulation layer 104. The protective layer 109 is then subjected to exposure and development processes, so that the protective layer 109 is removed other than the portion located between the electrode 111 of the first doped layer 11 and the electrode 121 of the first doped layer 12. Finally, the metal layers 34 are each overlaid with an electrically conductive linker 2 for connection to external circuits. According to this embodiment, when the LED die package is mounted, for example, on a printed circuit board by using a reflow soldering process, the residual portion of the protective layer 109 functions to prevent the melted electrically conductive linkers 2 disposed on the electrode 111 of the first doped layer 11 and the electrode 121 of the first doped layer 12, respectively, from contacting each other and causing a short circuit.

Similarly, the insulation layer 104 and the protective layer 109 are preferably made by a transparent material doped with phosphor powder.

Figure 22:
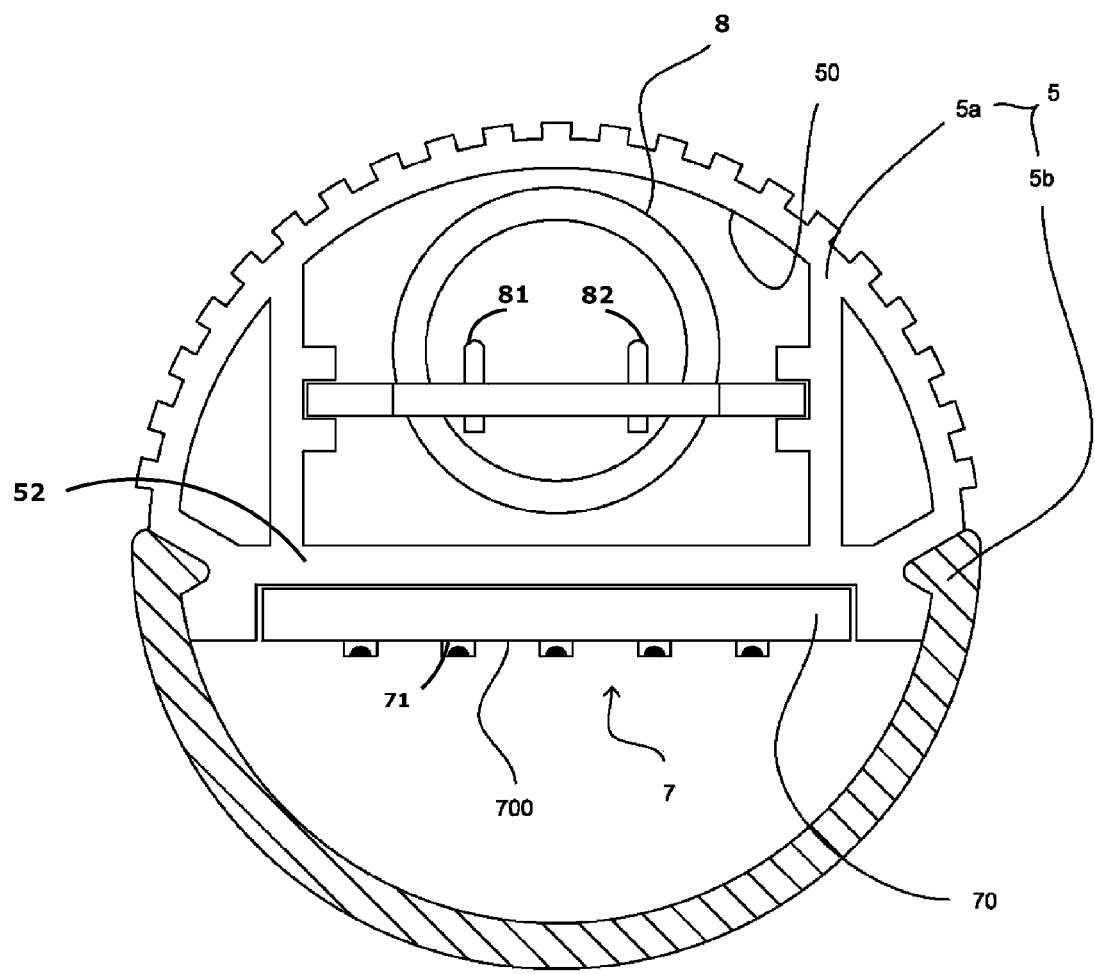
FIGS. 22 and 23 are schematic cross-sectional views of an illumination apparatus that uses an LED die package according to the invention.
Figure 23:
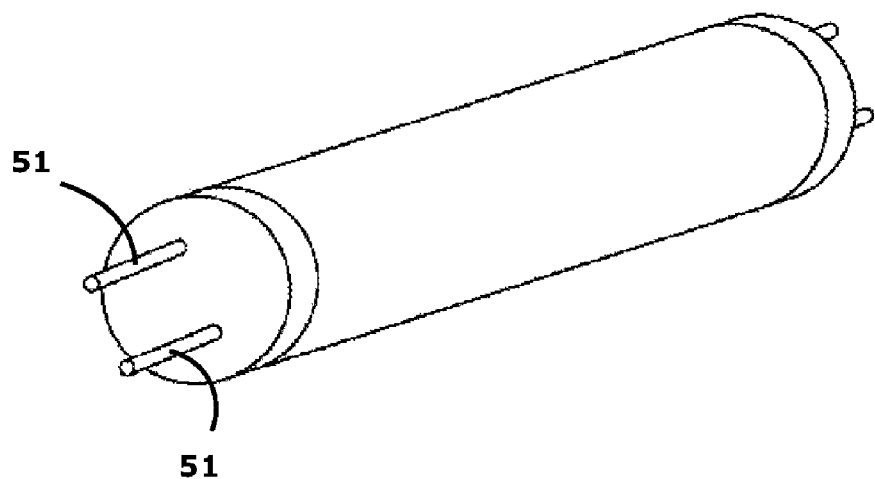

FIGS. 22 and 23 are schematic cross-sectional views of an illumination apparatus that uses an LED die package according to the invention.

The illumination apparatus includes an elongated housing 5, a power supplying circuit unit 8 and a light-emitting unit 7.

The housing 5 is composed of a base part 5a and a transparent part 5b. The base part 5a has a chamber 50 for accommodating the power supplying circuit unit 8 and a mounting surface 52 for receiving the light-emitting unit 7.

The power supplying circuit unit 8 disposed within the chamber 50 is provided with an input terminal 81 and an output terminal 82, which are electrically connected to electrodes 51 located at both ends of the housing 5 and acting like the electrodes provided at both ends of a conventional fluorescent lamp tube.

The light-emitting unit 7 includes a mounting substrate 70 disposed on the mounting surface 52 of the base part 5a and a plurality of LED die packages 71 placed on a mounting surface 700 of the mounting substrate 70. The mounting surface 700 of the mounting substrate 70 is overlaid with predetermined circuit traces (not shown) electrically connected to the output terminal 82 of the power supplying circuit unit 8. The electrically conductive linkers (see FIG. 4) of the LED die packages 71 are electrically connected to the corresponding circuit traces overlaid on the mounting substrate 70. It should be noted that the LED die packages 71 used herein are not limited to those described in the embodiments according to the invention but include any suitable LED die packages for the purpose of the invention.

Figure 24:
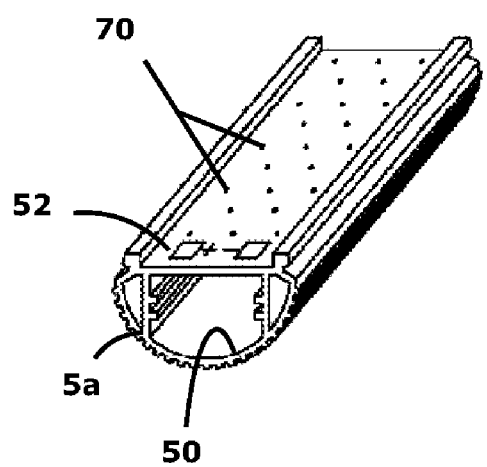
FIG. 24 is schematic cross-sectional view of an alternative example of the illumination apparatus shown in FIGS. 22 and 23.

FIG. 24 is schematic cross-sectional view of an alternative example of the illumination apparatus shown in FIGS. 22 and 23.

As shown in FIG. 24, this embodiment differs from the illumination apparatus shown in FIG. 22 in that circuit traces 701 are mounted on a mounting surface 51 of the base part 5a, and in that the LED die packages 71 are directly mounted on the mounting surface 51 and electrically connected to the corresponding circuit traces. As a result, the mounting substrate 70 is omitted.

Figure 25:
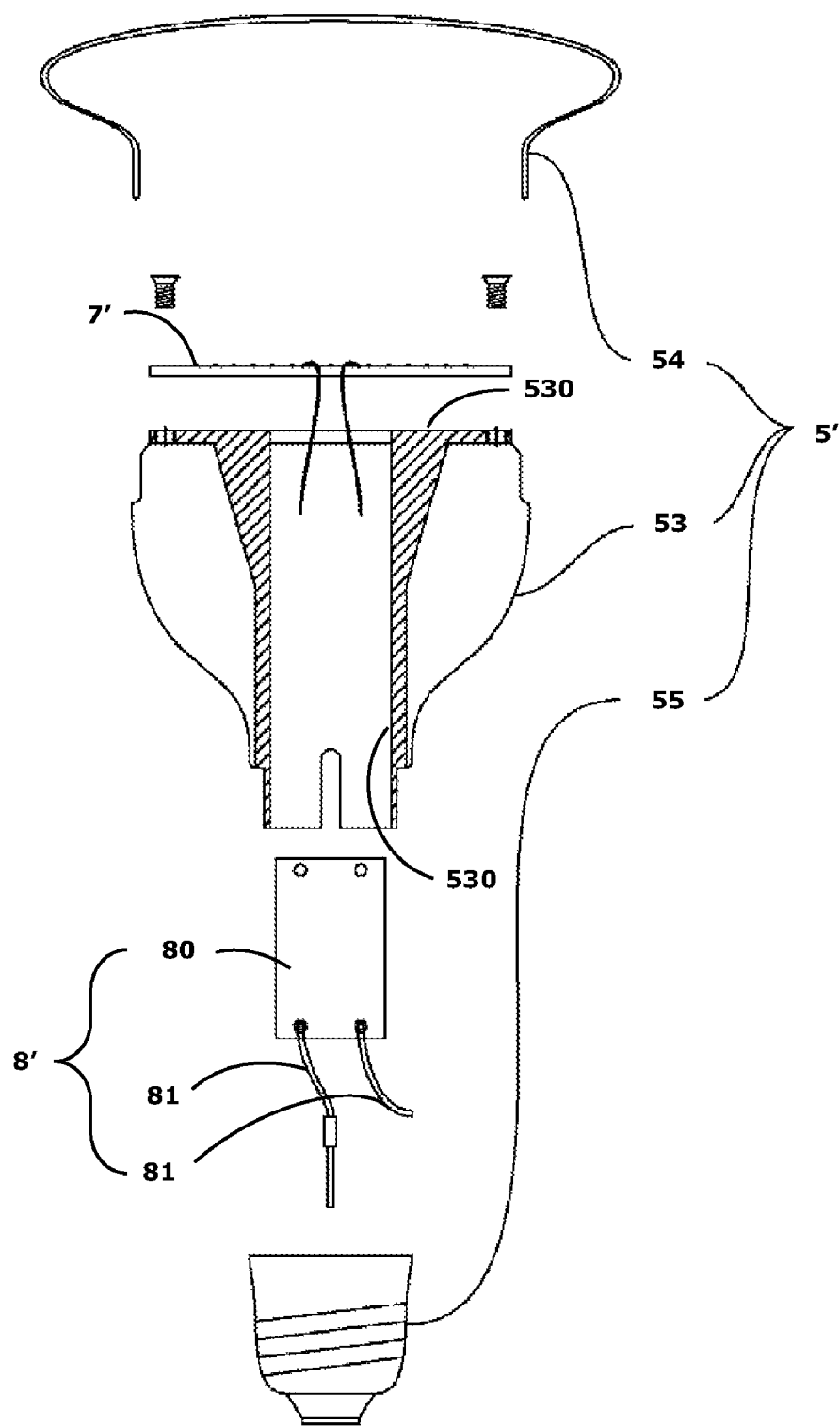
FIGS. 25 to 27 are schematic cross-sectional views of another illumination apparatus that uses an LED die package according to the invention.
Figure 26:
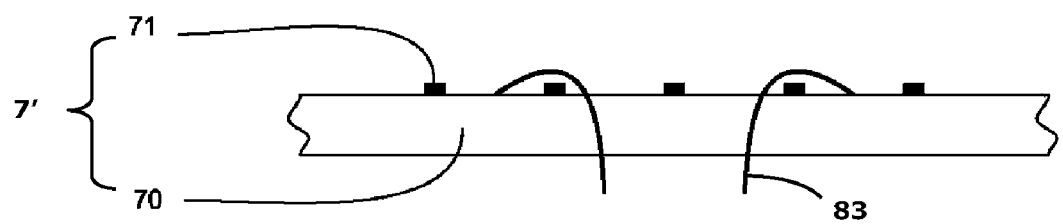
Figure 27:
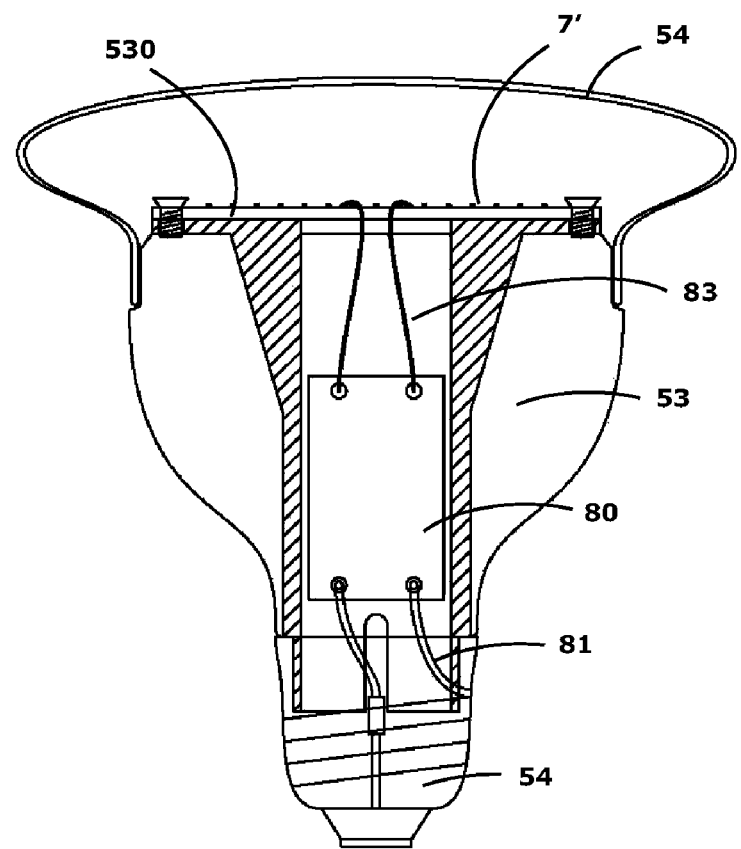

FIGS. 25 to 27 are schematic cross-sectional views of another illumination apparatus that uses an LED die package according to the invention.

As shown in FIGS. 25 to 27, the illumination apparatus includes a housing 5', a power supplying circuit unit 8' and a light-emitting unit 7'.

The housing 5' includes a body 53, a transparent cap 54 and an adapter 55. The body 53 has an upper surface 530 for receiving a substrate 70 of the light-emitting unit 7' and an accommodating chamber 531 for accommodating a power supplying module 80 of the power supplying circuit unit 8'. The accommodating chamber 531 is accessible through a lower open end of the body 53.

The transparent cap 54 is fixed to an upper end of the body 53, so as to allow the transmission of light from the light-emitting unit 7' disposed on the upper surface 530 of the body 53 to outside of the apparatus.

According to the embodiment, the adapter 55 is configured as an E27-type adapter and mounted at the lower open end of the body 53.

The power supplying circuit unit 8' has a power supplying module 80 which is placed into the accommodating chamber 531 through the lower open end of the body 53. The power supplying module 80 includes input terminals 81 electrically connected to a positive-voltage electrode and a negative-voltage electrode of the adapter 55.

The light-emitting unit 7' includes a substrate 70 mounted on the upper surface 530 of the body 53 and a plurality of LED die packages 71 operatively mounted on the substrate 70. A surface of the substrate 70 on which the LED die packages 71 are mounted is overlaid with predetermined circuit traces (not shown) for electrical connection to the electrodes of the LED die packages 71. The power supplying module 80 has an output terminal 82 which is electrically connected to the corresponding circuit traces overlaid on the substrate 70 via a wire 83, so that the LED die packages 71 can receive electric power from the power supplying module 80.

Figure 28:
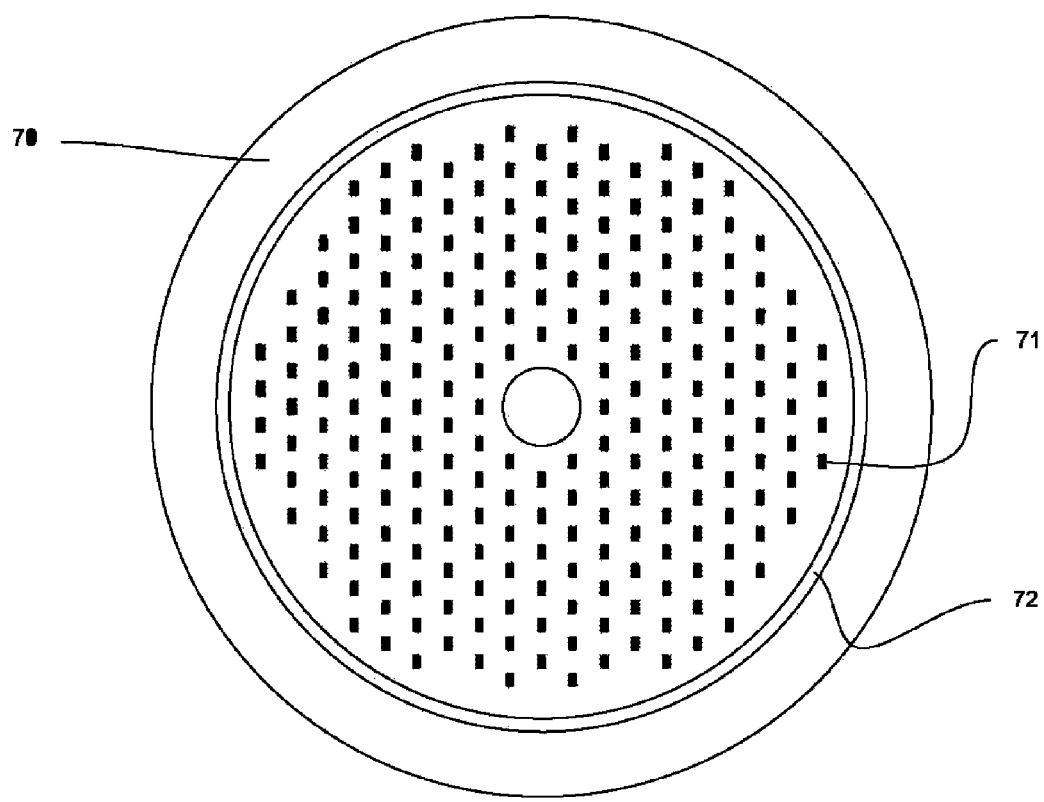
FIGS. 28 and 29 are schematic diagrams illustrating a light-emitting unit of an illumination apparatus that uses an LED die package according to the invention.
Figure 29:
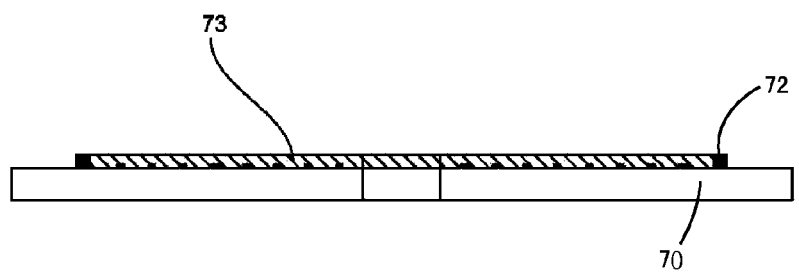
Figure 30:
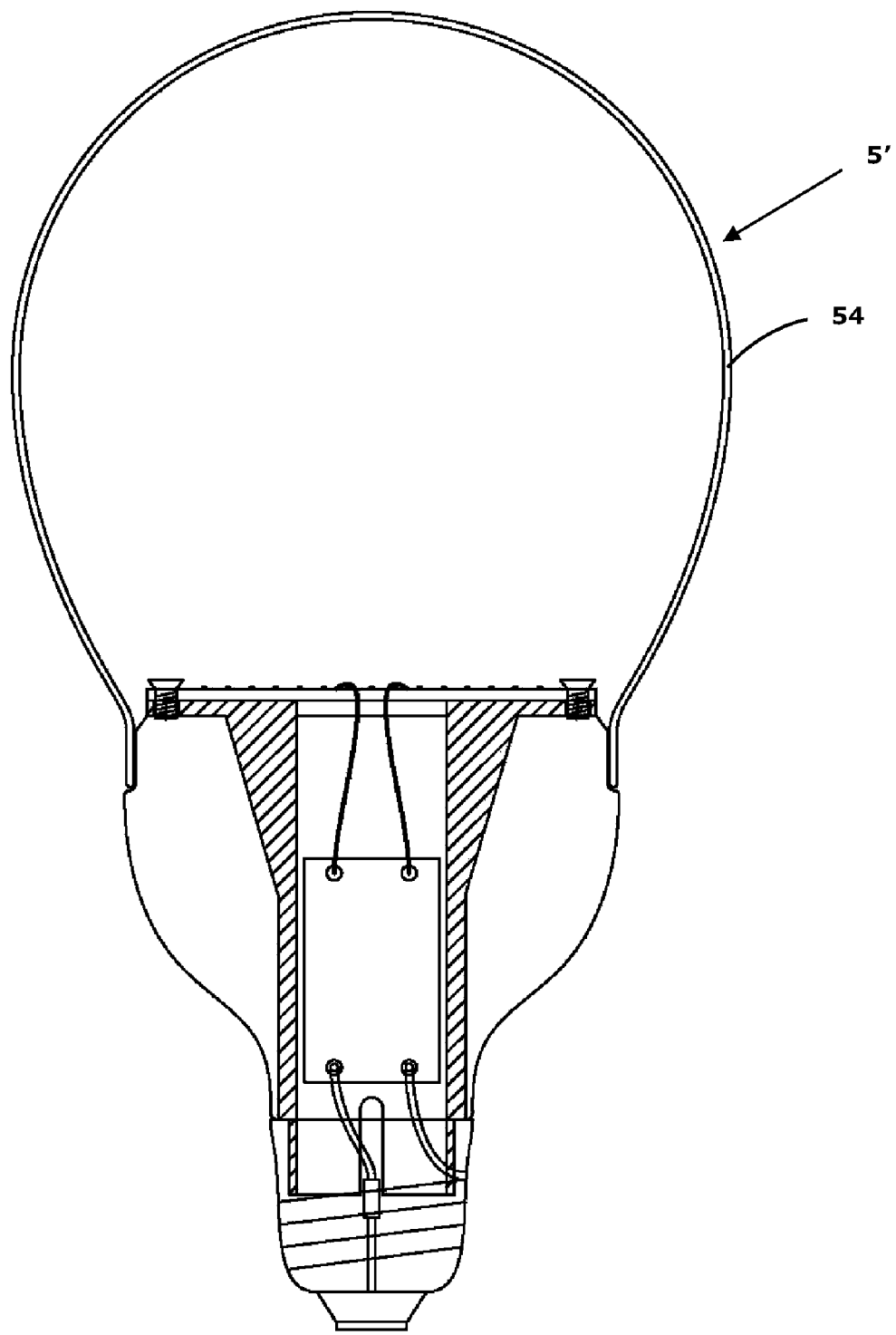
FIG. 30 is a schematic cross-sectional view of an alternative example of the illumination apparatus shown in FIG. 27.
Figure 31:
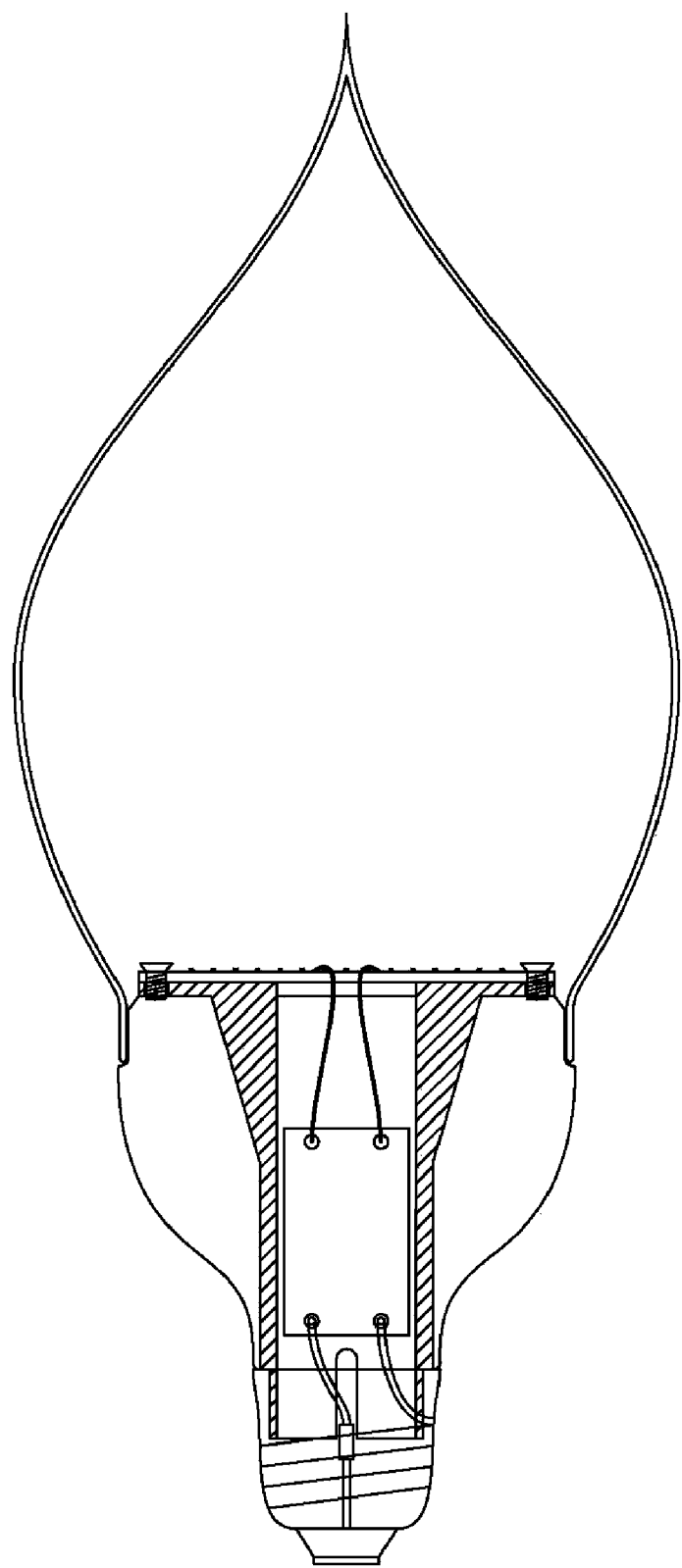
FIG. 31 is a schematic cross-sectional view of an alternative example of the illumination apparatus shown in FIG. 27.

It should be noted that the LED die packages 71 used herein may be any of the LED die packages described in the embodiments above. In addition, as shown in FIGS. 28 and 29, the light-emitting unit 7' may further include a circular ring 72 disposed on the substrate 70 in a manner surrounding the LED die packages 71 and a phosphor powder 73 disposed in the circular ring 72 in a manner covering the LED die packages 71. Further, the transparent cap 54 of the housing 5' may be configured into other shapes, such as those shown in FIGS. 30 and 31.

In conclusion, the LED die packages and the illumination apparatuses using the same as disclosed herein can surely achieve the intended objects and effects of the invention by virtue of the structural arrangements and operating steps described above.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit of the invention and the scope thereof as defined in the appended claims.

What is claimed is:

1. A light-emitting diode die package, comprising:
   a light-emitting diode die having a sapphire layer, a first doped layer disposed on the sapphire layer and doped with a p- or n-type dopant, and a second doped layer disposed on the first doped layer and doped with a different dopant from that doped in the first doped layer, wherein a surface of the sapphire layer opposite to the surface on which the first doped layer is disposed is formed with a plurality of generally inverted-pyramidal-shaped recesses, and wherein each of the first doped layer and the second doped layer has an electrode-forming surface formed with an electrode;
   a phosphor powder layer disposed on the surface of the sapphire layer formed with the recesses;
   an insulation layer disposed on the electrode-forming surfaces and formed with a plurality of exposure holes for exposing the electrodes corresponding thereto; and
   a plurality of electrically conductive linkers, each being formed within one of the exposure holes.

2. The light-emitting diode die package according to claim 1, wherein the recesses comprise inclined walls coated with metal layers.

3. The light-emitting diode die package according to claim 1,
   wherein the phosphor layer is selected from the group consisting of a yellow phosphor layer, a combined phosphor layer of a red phosphor layer with a green phosphor layer, and a combined phosphor layer of a red phosphor layer, a green phosphor layer with a blue phosphor layer.

4. The light-emitting diode die package according to claim 1, which further comprises:
   a thermal conductive film layer disposed on portions of the electrode-mounting surfaces that are exposed by the exposure holes;
   a high thermal conductive metal layer disposed on the thermal conductive film layer and composed of a metal material selected from the group consisting of a nickel layer combined with a gold layer, and an aluminum layer combined with a copper layer; and
   a protective layer disposed on the insulation layer, wherein the protective layer is patterned, so that only a portion of the protective layer located between the electrode of the first doped layer and the electrode of the first doped layer remains, and wherein the electrically conductive linkers are disposed on the high thermal conductive metal layer.

5. The light-emitting diode die package according to claim 1, wherein each of the electrically conductive linkers is fabricated by laminating 1 to 6 metal layers together using a vapor depositing process and/or an electro-plating process.

6. The light-emitting diode die package according to claim 5, wherein the electrically conductive linkers are composed of a silver layer, a diamond film layer, a copper layer, a nickel layer and a gold layer; or a silver layer, a copper layer, a nickel layer and a gold layer; or a chromium layer, a diamond film layer, a silver layer, a copper layer, a nickel layer and a gold layer.

7. An illumination apparatus, comprising:
   an elongated housing provided at both ends with an electrode adapted for being connected to an external socket, the housing having a base part and a transparent part, wherein the base part has a chamber and a mounting surface mounted with predetermined circuit traces;
   a power supplying circuit unit disposed within the chamber of the base part and provided with an input terminal and an output terminal which are electrically connected to the electrodes located at both ends of the housing; and
   a light-emitting unit including a plurality of light-emitting diode die packages placed on the mounting surface of the base part, wherein the electrodes of the light-emitting diode die packages are electrically connected to the corresponding circuit traces overlaid on the mounting surface of the base part;
   wherein the light-emitting diode die packages each comprise:
      a light-emitting diode die having a sapphire layer, a first doped layer disposed on the sapphire layer and doped with a p- or n-type dopant, and a second doped layer disposed on the first doped layer and doped with a different dopant from that doped in the first doped layer, wherein a surface of the sapphire layer opposite to the surface on which the first doped layer is disposed is formed with a plurality of generally inverted-pyramidal-shaped recesses, and wherein each of the first doped layer and the second doped layer has an electrode-forming surface formed with an electrode;
      a phosphor powder layer disposed on the surface of the sapphire layer formed with the recesses;
      an insulation layer disposed on the electrode-forming surfaces and formed with a plurality of exposure holes for exposing the electrodes corresponding thereto; and
      a plurality of electrically conductive linkers, each being formed within one of the exposure holes.

* * * * *